United States Patent [19]

Blackman et al.

[11] 4,062,107

[45] Dec. 13, 1977

[54] METHOD OF MANUFACTURING INFRA-RED DETECTOR

[75] Inventors: Maurice V. Blackman; Michael D. Jenner, both of Southampton, England

[73] Assignee: U.S. Philips Corporation, New York, N.Y.

[21] Appl. No.: 705,078

[22] Filed: July 14, 1976

[51] Int. Cl.² .......................................... H01R 43/00
[52] U.S. Cl. ........................................ 29/628; 29/593;
29/626; 250/332
[58] Field of Search ................ 29/625, 626, 627, 628,
29/426, 427, 401 A, 401 E, 401 F, 403, 401 R,
407, 593, 592; 427/88, 91, 99, 109, 124, 125;
250/330, 332

[56] References Cited

U.S. PATENT DOCUMENTS

| | | | |
|---|---|---|---|
| 3,453,711 | 7/1969 | Miller | 29/626 |
| 3,480,836 | 11/1969 | Aronstein | 29/626 X |
| 3,487,541 | 1/1970 | Boswell | 29/626 |
| 3,614,832 | 10/1971 | Chance et al. | 29/626 |
| 3,691,628 | 9/1972 | Kim et al. | 29/626 X |
| 3,719,990 | 3/1973 | Long et al. | 29/628 |
| 3,846,820 | 11/1974 | Lampe et al. | 250/334 X |
| 3,851,173 | 11/1974 | Taylor et al. | 250/332 |
| 3,908,075 | 9/1975 | Jackson et al. | 174/68.5 |
| 3,930,115 | 12/1975 | Uden et al. | 174/52 PE |

FOREIGN PATENT DOCUMENTS

1,401,434  7/1975  United Kingdom.

Primary Examiner—Victor A. DiPalma
Attorney, Agent, or Firm—Frank R. Trifari; Carl P. Steinhauser

[57] ABSTRACT

A method of manufacturing an infra-red detector in which a printed form of lead-out contact pattern is applied to the surface of each infra-red sensitive element. A detector element of infra-red sensitive material is provided having at one major side at least one active surface area defined between spaced contact layers which extend over oppositely located curved edges of the element at said side. The element is adhered via the opposite major side to an insulating substrate having a contact pattern provided thereon. Electrically conductive material is deposited to forming interconnections between the contact layers on the element and adjacently situated end portions of lead-out conductors of the contact pattern.

16 Claims, 20 Drawing Figures

METHOD OF MANUFACTURING INFRA-RED DETECTOR

This invention relates to methods of manufacturing infra-red detector devices.

The manufacture of infra-red detector devices comprises the formation of infra-red detector elements, the mounting of the elements on suitable substrates, the application of electrical connections to the elements, the testing of the elements provided with said connections and the eventual encapsulation of the elements and applied contacts in a suitable envelope. Infra-red detector devices in some forms comprise only a single infra-red detector element and in other forms comprise a plurality of infra-red detector elements, for example arranged as a linear array. For devices in which the operation is dependant upon the bulk photoconductivity of the infra-red sensitive material the manufacture of the elements comprises steps such as material preparation, element definition by a combination of etching and polishing techniques, surface treatments and application of contact layers.

For the manufacture of those devices comprising an array of infra-red detector elements the problem of yield occurs when, as is customary, the array comprises the arrangement of the detector elements in one or more groups each formed in a common body of the infra-red sensitive material. This socalled 'monolithic' approach to the fabrication of a group of detector elements hitherto has given rise to certain problems. Thus where, for example a group of ten elements are formed in a single comb-shaped body, if after mounting and application of electrical connections one of the individual elements of a group is found to be faulty on testing then the whole group has to be replaced. In addition to this being costly in terms of the infra-red sensitive material and the elements formed therein that have to be discarded, the disadvantage arises that the electrical connections to the whole group in the form of individually connected wires have to be removed and reapplied. The same disadvantages apply if one element of a group formed in a single body fails during use and a repair of the detector device has to be made.

One major problem which arises, both in the manufacture of single element devices and in the manufacture of arrays is concerned with the means whereby electrical connections are made to the or each individual infra-red detector element. Hitherto this has been effected by the application of wire leads on metallised surface portions of the element or elements for example by a thermocompression bonding process or a soldering process. Due to the deformation of the wire end that is associated with a thermocompression bonding operation, for example as occurs in nail-head bonding, steps have to be taken to ensure that the area of the part of the element to which the wire is bonded is sufficient to accommodate the finally deformed wire end in such manner that said deformed wire end lies entirely on the element. This can unduly complicate the element design and place further limitations on the achievable minimum separation between adjoining elements in an array. Also soldering is a process which places similar limitations on the said separation and the heating associated with the process of soldering leads to certain problems.

Another problem arises in the so-called monolithic approach when it is desired that the spacing of the individual elements in a group formed in a common body shall be small. Where the separation of the active surface areas of the elements in such a body is defined by an etching process there exists a limitation for the minimum separation that can be achieved because in general when etching the body of infra-red sensitive material the width of a channel will normally be considerably in excess of the thickness of the body. Thus even if the thickness of the body is reduced to 6 microns it is not readily possible by etching to achieve a separation of individual elements of less than 12 microns.

If the element definition takes place before the final reduction in thickness the handling of the bodies can be extremely difficult. Furthermore it may be desired to produce multi-element detector devices in which the separation of the elements for example in a linear array, is not uniform, for example in order to yield different degrees of resolution at different parts of the array of detector elements. In such a case the formation of a plurality of elements in a single body with different spacing between elements at different parts of the array gives rise to many difficulties and can be extremely costly in terms of the material required.

According to the invention there is provided a method of manufacturing an infra-red detector device comprising providing at least one detector element of infra-red sensitive material having at one major side at least one active surface area defined between a pair of electrically conductive contact layers spaced apart on the surface and provided extending over a pair of oppositely located curved edges of the element at the said one major side, adhering the opposite major side of the or each element to an insulating substrate provided on one surface with an electrically conductive pattern of lead-out conductors, the said oppositely located curved edges of the or each element being located in the proximity of oppositely located end portions of lead-out conductors of the pattern, and applying electrically conductive material to form interconnections between the contact layers on the or each element and the adjacently situated end portions of the lead-out conductors, said interconnections extending as conductive layers on the upper surface of the lead-out conductors and at least on those portions of the contact layers of the or each element situated over the said curved edges at the one major side.

This method can provide significant advantages in terms of the ease of defining the position of the active surface area of the or each element on the insulating substrate, reliability of interconnections, small separation of elements in multi-element devices, materials savings, and the ability to custom build detector devices of a wide variety of configurations.

The method employs elements provided with contact layers in such manner that the mounting and the provision of further connection to the elements is readily achievable by deposition techniques and does not require the use of wire bonding or other techniques and the disadvantages associated therewith. In particular the provision of the elements with the oppositely located curved edges having contact layers thereon enables the further steps of the method to be advantageously employed in so far as the provision of the said interconnections is achieved without formation of large steps in the deposited conductive material. In respect of the means whereby the elements are obtained reference is invited to our co-pending Patent Application Ser. No. 704,999, filed July 14, 1976.

Although within the scope of the present invention there is included a method of manufacturing a single-element device the use of the method is particularly further advantageous in the manufacture of multi-element devices. The method enables the spacing of the elements in such devices to be chosen after forming the elements and where desired to be considerably smaller than is readily obtainable by the prior art monolithic approach. Furthermore the provision of multi-element devices with different spacings between the elements and/or different sizes of the active surface areas of the elements is readily obtainable. Another significant advantage arises, as will be described hereinafter, in respect of the means whereby an element which is faulty on test may be replaced.

Although within the scope of the invention there is a method in which the or each element is located on the surface of the insulating substrate in an interval between substantially parallel facing edges of the end portions of two lead-out conductors of the pattern, in a preferred form the spacing of the said facing edges is deliberately made less than the element cross-dimension in a direction normal to the said curved edges. In this preferred form the electrically conductive pattern of lead-out conductors is such that for the mounting of the or each element, in a direction extending between the said oppositely located curved edges of the element the distance between oppositely located end portions of the associated lead-out conductors corresponds substantially to the dimension in said direction of the active surface area of the element between the pair of contact layers, the or each element being mounted on the substrate with the active surface area situated above the interval between said end portions of the lead-out conductors and with the contact layers situated above the end portions of the lead-out conductors. In this manner it is possible to obtain reliable interconnections between the contact layers on the elements and the end portions of the lead-out conductors with a high degree of accuracy of location of the or each element. Effectively, in this preferred embodiment, the pattern of lead-out conductors is formed in such manner that the location of the active surface area of the or each infra-red detector element is predetermined and when the device is in the form, for example, of a linear array of elements the desired alignment of the elements is readily obtained. In this preferred form in which the or each element is mounted on the substrate with the contact layers situated above the end portions of the associated lead-out conductors of the pattern, in order to obviate the element being spaced by too great a distance from the substrate surface and forming a type of bridging between the oppositely situated end portions of the lead-out conductors, said end portions at least over the length thereof above which an element is supported may be of reduced thickness. This measure is found to be desirable particularly when using an epoxy resin adhesive for adhering the or each element to the substrate. Furthermore when using such an adhesive the necessary insulation between the end portions of the lead-out conductors is obtained.

When using such a pattern of lead-out conductors in which the end portions at least over the length thereof above which an element is supported are of reduced thickness it is preferable to form the said interconnections as conductor layers extending on the lead-out conductors beyond the parts thereof of reduced thickness. In this manner reliable low resistance interconnections can be obtained.

In one form of the method the or each element is strip-shaped and of substantially rectangular surface area, the pair of contact layers and the active surface area defined therebetween extending across the width of the strip. For a full description of the preparation of elements of such configuration having the applied contact layers and the advantages there of reference is invited to our co-pending Patent Application Ser. No. 704,999.

In said one form the end portion of the lead-out conductor and the conductive layer interconnection at least on one side of the active surface area of the or each element are both in the form of metal strips extending substantially parallel to the element. Such a form of the method may be employed in the manufacture of a device comprising at least one group of detector elements having their active surface areas arranged in a substantially straight line, the end portions of lead-out conductors to be overlaid by contact layers adjacent one edge of the group of elements being present on the surface of the insulating substrate in the form of a plurality of substantially parallel extending strips situated substantially normal to the said line and having a pitch distance corresponding substantially to the desired pitch distance of the elements. In this manner the desired location of the active surface areas of the elements and the provision of interconnections between the lead-out conductors and the contact layers on the elements may be readily obtained, particularly when the spacing of the elements is to be small.

For connection to the contact layers extending on the other edges of said group of elements a common lead-out conductor may be present on the insulating substrate, the longitudinal edge of the end portion of said common lead-out conductor to be overlaid by the said contact layers lying substantially parallel to the said line. The provision of such a common lead-out conductor in this configuration enables a simplification of the pattern of lead-out conductors.

The infra-red detector device may comprise a plurality of said groups of detector elements and on each of the two opposite sides of the line in which the active surface areas of the detector elements are to be arranged the lead-out conductors are present on the surface of the insulating substrate alternately as a plurality of strips associated with one group of detector elements to be provided and as a common lead-out conductor associated with the next adjacent group of detector elements to be provided.

The method may be employed in the manufacture of a device in which the pitch distance between individual ones of a first plurality of the elements in the device is different to the pitch distance between individual ones of a second plurality of the elements in the device, said difference in pitch distances being accommodated by the provision of lead-out conductors on the insulating substrate having end portions in the form of strips of different pitch distances. This measure may be suitably employed in the manufacture of a device of the said form in which the elements have different spacings and in which the active surface areas of the elements are of at least two different sizes. In such a manufacture in the direction normal to the oppositely located curved edges the elements may be provided all having the same dimension and the active surface area of each of the first plurality of elements is different to the active surface area of each of the second plurality of elements, said difference in active surface areas being provided by the elements having a different cross-dimension in the direction parallel to the oppositely located curved edges.

In a preferred form of the method after forming the interconnections between the contact layers on the or each element and the lead-out conductors, the or each element is tested, any element which fails to meet the testing requirements being mechanically removed from the insulating substrate and replaced by adhering a further element in the corresponding position on the surface of the insulating substrate, a further application of conductive material being effected to form interconnections at least between the contact layers on the or each further, replacement element and the adjacently situated end portions of the pattern of lead-out conductors. This preferred form enables one or more faulty elements to be replaced and interconnected in a simple manner and may be employed both in the manufacture of single element devices and multi-element devices. In the manufacture of a multi-element device the said further application of conductive material may be effected, in addition to establishing interconnection to the replaced element or elements, by deposition also on the previously formed interconnections to the elements which pass the testing requirements so that in these areas a thickening of the previously applied conductive layers will occur. In the said preferred form the provision of the first formed interconnections between the contact layers on the or each element and the lead-out conductors and the provision of the subsequently formed corresponding interconnections to the or each replacement element may be both effected using a photomasking and metal layer deposition process, the same masking being used in each process. In this manner one or more faulty elements may be replaced and interconnected without the necessity for forming a special mask for the interconnection of the replacement element or elements. In the manufacture of a multi-element device it has been found possible to effect up to five further depositions of interconnection conductive layers using the same masking in each deposition.

The said repeated deposition of the conductive material to form interconnections to one or more replacement elements is particularly appropriate in a form of the method in which the application of conductive material to form interconnections is effected by deposition on portions of a photolithographically defined photoresist layer, said portions serving to mask surface parts of the or each element and the substrate where the deposited material is not required, the material deposited on the photoresist layer portions being subsequently removed by dissolving said photoresist layer portions. In this manner a form of lift-off technique is used to remove the material deposited on the photoresist layer portions.

Embodiments of the invention will now be described, by way of example with reference to the accompanying diagrammatic drawings, in which.

The Figures in the accompanying drawings are not to scale and consequently the relative dimensional proportions are totally distorted, particularly in practice the thickness of the various layers in relation to their lateral extent will be much smaller than would otherwise be apparent from the drawings.

The embodiments of the method to be described with reference to FIGS. 4 to 16 and FIG. 17 comprise the manufacture of a multi-element linear array infra-red detector device in which the infra-red sensitive elements are of cadmium mercury telluride. In these embodiments the material composition, that is the atomic ratio of cadmium to mercury, is chosen such as to produce a cut-off wavelength in the region of 12 microns.

Figure 1:
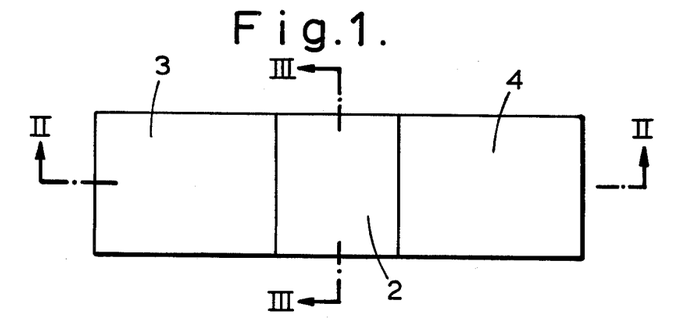
FIG. 1 is a plan view of an infra-red detector element with applied contact layers.
Figure 2:
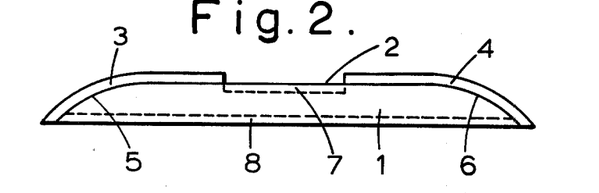
FIGS. 2 and 3 are cross-sections taken along the lines II—II and III—III respectively of FIG. 1.
Figure 3:
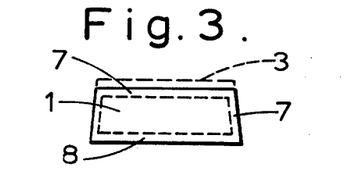

In the first embodiment to be described with reference to FIGS. 4 to 16 the infra-red detector elements are each of the form as shown in FIGS. 1 to 3. Each detector element 1 is of rectangular surface configuration having an overall area of 50 microns × 200 microns and a maximum thickness of approximately 9 microns. At one major side, that is the upper side shown in the Figures, an active surface area 2 is defined between a pair of electrically conductive contact layers 3 and 4 spaced apart on the surface and provided extending over a pair of oppositely located curved edges 5 and 6 of the element 1 at the said one major side. In the present embodiment the active surface area defined between the contact layers 3 and 4 is of 50 microns × 50 microns. The conductive contact layers 3 and 4 are of gold. In practice the layer 4 is of a substantially constant thickness of 0.5 micron whereas the layer 3 is in part of 0.5 micron thickness and in part of 1 micron thickness.

The asymmetry in the thickness of the contact layers is a result of the method of manufacturing the element and in this respect reference is invited to our co-pending Patent Application Ser. No. 704,999. As this asymmetry plays no essential part in the method in accordance with the invention and in order to facilitate simplification of the drawings the contact layers 3 and 4 are shown in the relevant Figures as having equal thickness. The active surface area 2 comprises a thin passivation layer 7. The layer 7 is also present at the exposed side surfaces of each element. On the lower surface of each element there is a thin oxide layer 8.

Figure 4:
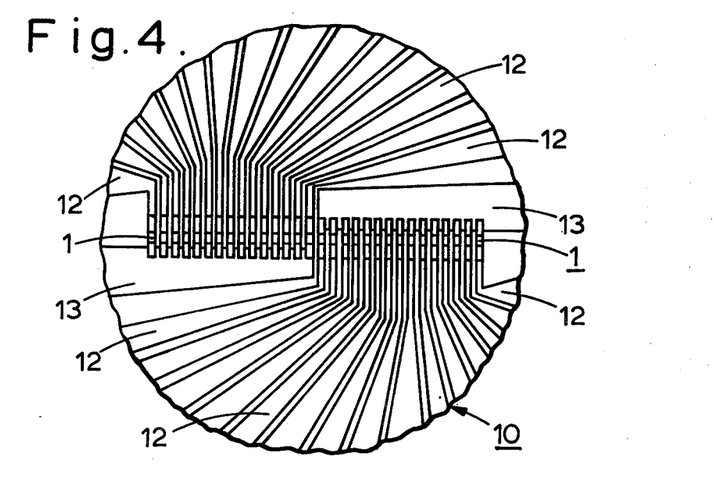
FIG. 4 shows a plan view part of part of an insulating substrate having an applied conductive pattern of lead-out conductors together with a plurality of infra-red detector elements adhered to the substrate.

FIG. 4 shows in plan view the central part of an infra-red detector device manufactured by a method in accordance with the invention. The device comprises an insulating substrate 10 in the form of a disc of high density alumina and of 8.5 mm diameter and 0.5 mm thickness. On the upper surface of the substrate there is a conductive pattern of lead-out conductors formed in a deposited layer of Nichrome and gold having a total thickness of 0.8 micron. Along a diameter on the surface of the substrate disc 10 there are arranged thirty elements 1 of the form shown in FIGS. 1 to 3. These elements 1 are arranged in a line and the geometry of the contact pattern of lead-out conductors is effective in determining the elements in two groups each of fifteen elements. Thus for each group of elements the contact pattern comprises fifteen lead-out conductors 12 having parallel strip portions at one end situated adjacent the contact layers at one side of the elements and a common lead-out conductor 13 situated adjacent the contact layers at the other side of the elements. The fifteen parallel strip portions of the lead-out conductors associated with the two groups of elements are situated on opposite sides of the elements and fan-out into wider contact areas distributed around approximately half the circumference of the disc, it being noted that FIG. 4 shows only the central part of the disc.

For the sake of clarity of illustration the interconnections between the elements and the lead-out conductors 12 are not shown in FIG. 4, this Figure thus corresponding to a stage in the manufacture of the device subsequent to adhering the elements to the substrate but prior to forming the interconnections. The interconnections are formed by deposited conductive layer portions of gold which extend on the contact layers 3 and 4 on the elements and on the adjoining surfaces of the end portions of the lead-out conductors. Those interconnections which are present at the side of the elements adjoining the strip-form end portions of the lead-out conductors 12 consist of strips of substantially the same width as the end portions of the lead-out conductors. Those interconnections which are present at the side of the elements adjoining the end portion of the common lead-out conductor 13 consist of a common interconnection extending across the entire width of the 15 elements in a group. A more detailed explanation of these interconnections will be given in the following description of a method of manufacturing the device shown in FIG. 4, said method being described with reference to FIGS. 5 to 16.

Figure 5:
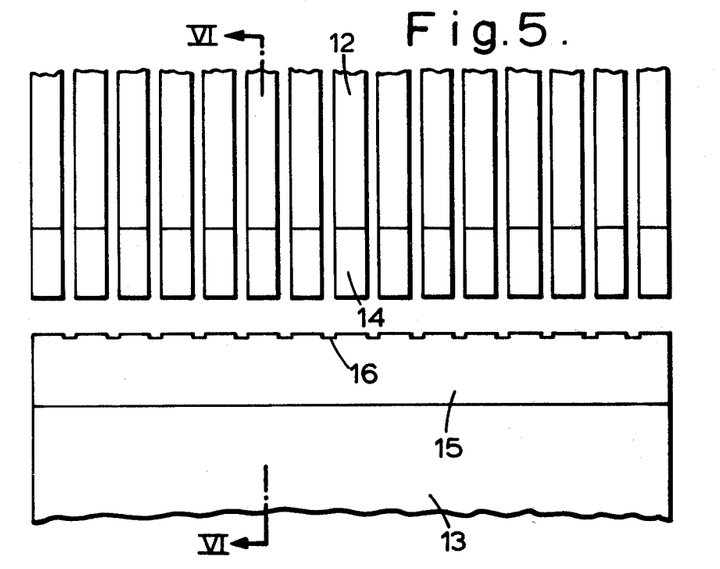
FIG. 5 is an enlarged plan view of part of the insulating substrate shown in FIG. 4 prior to the adhering of the elements to the substrate.
Figure 6:
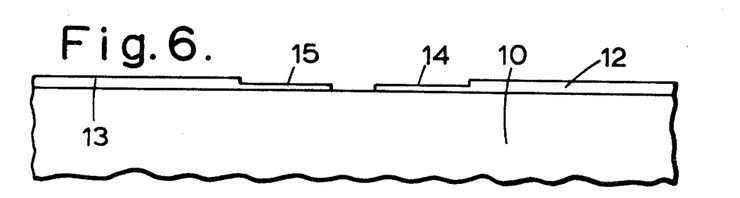
FIG. 6 is a cross-sectional view taken along the line VI—VI of FIG. 5.

FIG. 5 shows in plan view that part of the substrate at which the end portions of the lead-out conductors to be associated with one group of fifteen elements are present. Each of the end portions of the lead-out conductors 12 is in the form of a strip of 45 microns width. The pitch distances of the strips is 62.5 microns and the separation between adjoining strips is 17.5 microns. The end portions of the common lead-out conductor 13 has a width of approximately 830 microns. The distance between the facing edges of the end portions of the lead-out conductors 12 and 13 corresponds to the dimension in said direction of the active surface area of each element 1 to be later applied, namely 50 microns. Parts 14 and 15 of the end portions of the lead-out conductors 12 and 13 are of reduced thickness which has been obtained by the selective etching of these parts of the lead-out conductors. In the present case the parts 13 and 14 are of approximately 500 A thickness and in a direction normal to the center line in which the active surface areas of the elements are to be located extend over a length of the conductors which is of 75 microns in each case. The part 15 of the end portion of the lead-out conductors 13 has indentations 16 of 17.5 microns in length which serve to aid the subsequent correct mounting of the elements and alignment of the active surface areas.

Figure 7:
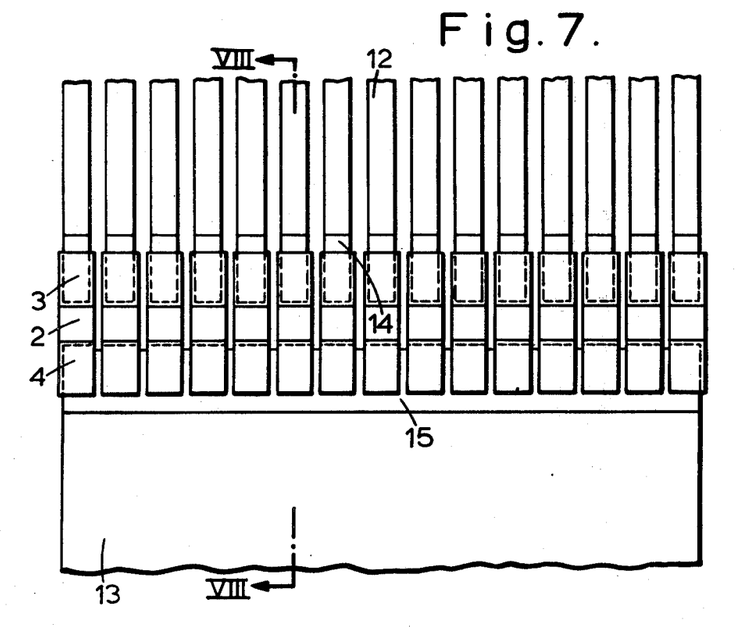
FIG. 7 is a plan view, corresponding to that of FIG. 5, of the part of the substrate at a later stage in a method in accordance with the invention after mounting the elements thereon.
Figure 8:
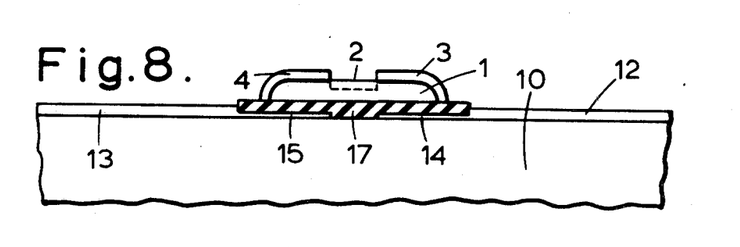
FIG. 8 is a cross-sectional view taken along the line VIII—VIII of FIG. 7.

In the mounting of the elements 1 on the substrate the first step is the application of an epoxy resin adhesive on the substrate selectively along a linear strip comprising the gap between the end portions of the lead-out conductors and the reduced thickness parts 14 and 15 of the lead-out conductors. This is effected by applying a droplet of the resin and spreading it to obtain a strip of approximately 3 microns thickness. Before the resin hardens the elements 1 are positioned on the substrate in the desired location with the active surface areas directly lying over the interval between the end portions of the oppositely located lead-out conductors and with the contact layers 3 and 4 on the elements lying above the reduced thickness parts 14 and 15 respectively (see FIGS. 7 and 8) of the lead-out conductors 12 and 13. This operation is effected manually by an operator with the substrate positioned under microscopic examination. Due to the presence of the passivation surface layer 7 situated between the contact layers 3 and 4, the active surface area is readily visually identified and the gold pattern of lead-out conductors on the substrate is also readily identified. The described geometry of the pattern of the lead-out conductors together with the ease of identification of the active surface areas of the elements enables a precise positioning and alignment of the elements to be obtained. FIGS. 7 and 8 show the substrate with the elements 1 adhered thereto via the epoxy resin 17. From the section of FIG. 8 it is apparent that the epoxy resin strip 17 serves to electrically insulate the underside of the element 1 from the reduced thickness parts 14 and 15 of the lead-out conductor end portions. Furthermore it is apparent from both FIGS. 7 and 8 that the elements are located only above said parts 14 and 15 of reduced thickness of the end portions of the lead-out conductors and not above the adjoining thicker parts thereof. In the plan view of FIG. 7 said parts 14 and 15 where they are covered by the elements are shown in broken outline and for the purpose of convenience of illustration the facing ends of said portions are shown in broken outline in FIG. 7 and the following plan view of FIGS. 9, 11, 13 and 15 whereas in practice these ends will coincide with the lines which show the above situated facing ends of the contact layers 3 and 4 on the elements.

Following application of the elements to the substrate the excess resin is removed by spraying with a suitable solvent and then the remaining epoxy resin layer parts 17 are cured by braking in an oven for approximately 1 hour.

A layer of photoresist of approximately 8 microns thickness is then applied, by spraying, to the exposed upper surface of the substrate including the lead-out conductors 12, 13 and the elements 1 having the contact layers uppermost. By applying the photoresist in such a thickness the level of the photoresist on the areas outside the elements corresponds substantially to the level of the elements and the spaces between adjoining elements 1 are substantially filled. This enables a subsequent photomasking and developing process to be effectively used in which openings are formed in the photoresist layer above the contact layers 3 and 4 on the elements and above the adjacently situated parts of the end portions of the lead-out conductors 12 and 13. At the side of the elements at which the contact layers 3 and lead-out conductors 12 are present the openings are in the form of rectangular strips of 45 microns width and 130 microns length. In the direction of the width of said openings there is substantial alignment with the underlying parts 14 of the end portions of the lead-out conductors which are also 45 microns width. In the direction of length these openings extend 30 microns over the contact layers 3 and 100 microns over the end portions of the lead-out conductors 12. Thus they also expose the thicker parts of the lead-out conductors 12. At the opposite side of the elements at which the contact layers 4 and the common lead-out conductor 13 are present the opening is in the form of a single strip of 930 microns × 130 microns extending across the contact layers 4 and the adjoining parts of the common lead-out conductor 15. In the direction normal to the line in which the active surface areas of the elements are situated this single strip opening in the photoresist layer extends 30 microns over the contact layers 4 and 100 microns over the end portions of the common lead-out conductor 13. Thus this opening also exposes the thicker part of the common lead-out conductor 13.

Figure 9:
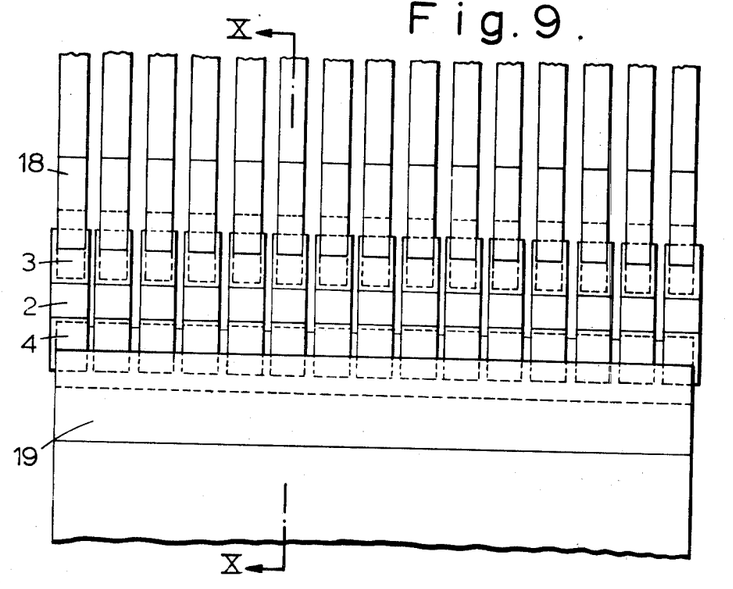
FIG. 9 is a plan view, corresponding to the plan views of FIGS. 5 and 7, at a further stage in a method in accordance with the invention after forming interconnections between contact layers on the elements and lead-out conductors of the pattern on the insulating substrate.
Figure 10:
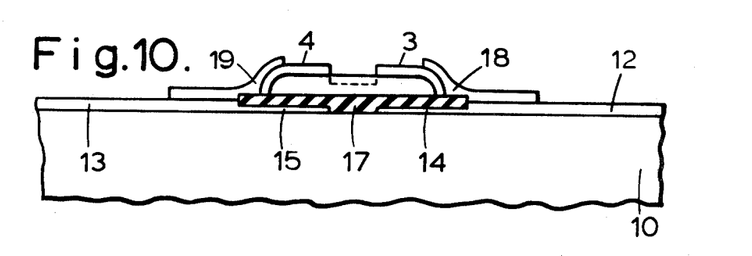
FIG. 10 is a cross-sectional view taken along the line X—X of FIG. 9, FIGS. 11, 13 and 15 show in plan view a part of the substrate at further stages in a method in accordance with the invention.

With the remaining parts of the photoresist layer present, including discrete portions extending over the whole of the active surface areas 2 of the elements 1, a layer of gold of 0.5 micron thickness is deposited by sputtering. Thereafter a gold plating process is effected to increase the thickness of the deposited gold layer to 1.5 microns. The residual portions of the photoresist layer are then dissolved with an appropriate solvent and in this manner the gold deposited thereon is removed by a lift-off technique. There remain, in the part of the substrate shown, a group of fifteen gold layer interconnections 18 (FIGS. 9 and 10) of 130 microns × 45 microns situated on and forming electrical connection between the contact layers 3 at one side of the elements and the adjoining end portions of the individual lead-out conductors 12 and a gold layer interconnection 19 (FIGS. 9 and 10) of 130 microns × 930 microns situated on and forming electrical connections between the contact layers 4 at the opposite side of the elements and the adjoining end portion of the common lead-out conductor 13. Due to the provision of the curved edges of the elements 1 and the described location of the elements 1 on the reduced thickness parts of the end portions of the lead-out conductors 12 and 13 no large steps or discontinuities occur in the deposited interconnection layers 18 and 19 which if present could be a cause of electrical failure. FIGS. 9 and 10 show the thus applied interconnections formed by the gold layer parts 18 and 19.

The next stage in the manufacture of a detector device the mounting and further connection of the substrate 10 with applied elements and interconnections. In one example in which the device encapsulation is in the form of a Dewar vessel the substrate 10 is mounted with a suitable adhesive on the end surface of the inner glass vessel of such an envelope. Connections between the outer portions of the lead-out conductors 12 and 13 arranged around the circumference of the disc and terminal posts of wires embedded in the wall of the inner glass member and emerging at the outer periphery of the end surface of the inner glass member are made by thermocompression bonding gold wires. For a detailed description of one form of such an inner glass member having wire leads embedded in the wall thereof reference is invited to our U.K. Patent Specification No. 1,401,434. When all the necessary connections have been made the encapsulation is completed by sealing the outer vessel of the Dewar to the inner vessel. If the device is designed for low temperature operation then the space between the inner and outer vessels is evacuated.

Figure 11:
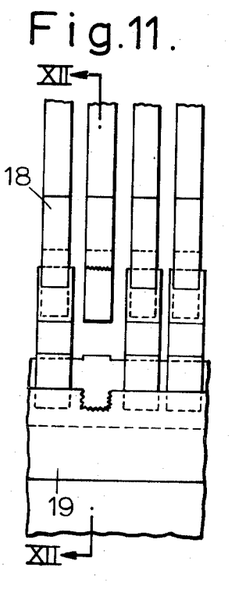
Figure 12:
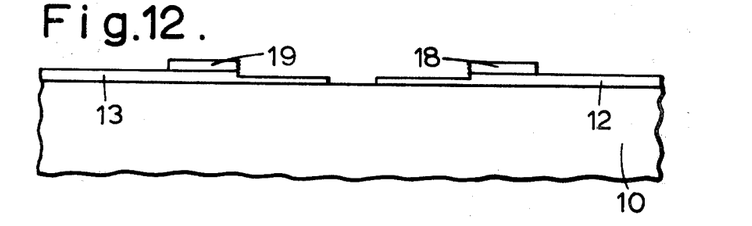
FIGS. 12, 14 and 16 are cross-sectional views respectively taken along the lines XII—XII of FIG. 11, XIV—XIV of FIG. 13, and XVI—XVI of FIG. 15.

Electrical tests are then carried out by making electrical connection to the wire leads associated with individual elements. The tests include the measurement of such parameters as responsivity, cut-off wavelength, time constant and D. Any elements 1 in the linear array which fail to meet the testing requirements are then identified. The Dewar encapsulation is then broken and the substrate 10 with applied elements is removed from the surface of the inner glass member after removing the wire connections between the outer portions of the lead-out conductors 12, 13 and the terminal posts. The or each identified faulty element is then removed from the substrate 10 by mechanical means, in this example with a small hand-held blade. FIG. 11 shows a small part of the array as shown in the previous FIGS. 5, 7 and 9 comprising the location of four elements, one of which has been removed in the described manner. The removal of this element is effected without removal of the previously underlying reduced thickness parts 14 and 15 of the end portions of the lead-out conductors. From FIG. 12 it is apparent that the outer parts of the interconnection conductive layers 18 and 19 remain.

Figure 13:
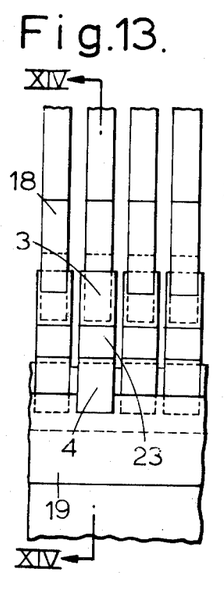
Figure 14:
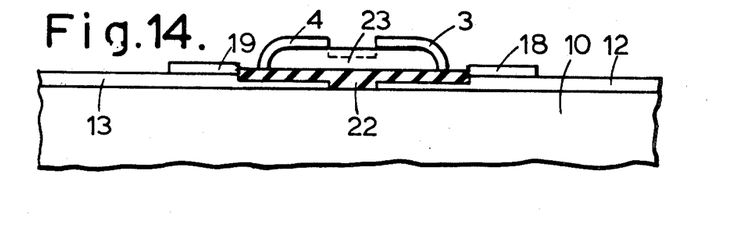
Figure 15:
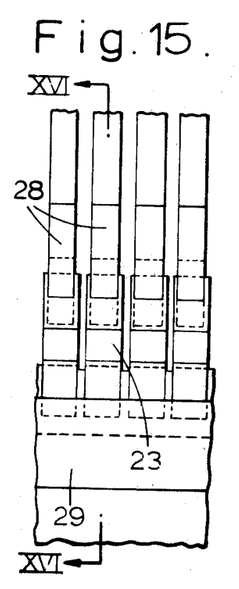
Figure 16:
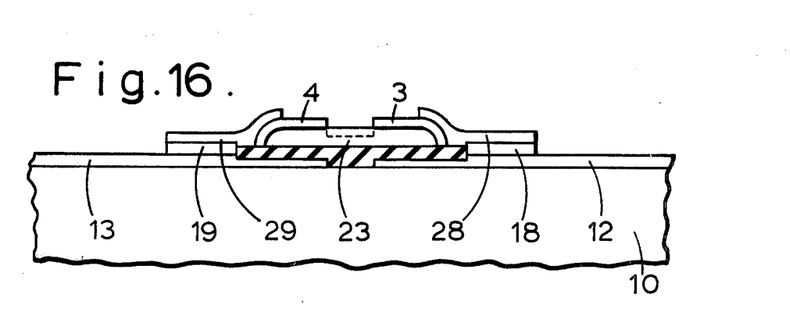

In the or each position on the surface of the substrate where an element has been removed a further quantity of epoxy resin 22 (FIG. 14) is applied and another element adhered in the same manner as previously described. FIGS. 13 and 14 show such a replacement element 23 adhered via the epoxy resin layer 22 in the position from which the faulty element 1 was removed.

After removing any excess epoxy resin by spraying with a suitable solvent and the necessary curing cycle of the residual epoxy resin a further layer of photoresist of approximately 8 microns thickness is applied on the entire upper surface of the substrate and elements. A photomasking and developing process is then effected, using the same masking as previously applied, to form openings in the photoresist layer of exactly the same configuration and area position as in the previous stage where the openings were defined in the photoresist layer. Thus in the positions where the first applied elements 1 are situated only the interconnection conductive layers 18 and 19 will be exposed but in the or each position where a replacement element 23 is situated the surfaces of parts of the contact layers 3 and 4 thereon and the surfaces of the adjacently situated parts of the end portions of the lead-out conductors 12 and 13 will be exposed.

A further deposition of gold by sputtering is effected to obtain a deposited layer of 0.5 micron thickness. The substrate is then mounted on a suitable carrier and an electroplating of gold is effected on the previously deposited gold layer to increase the thickness to 1.5 microns. The remaining photoresist layer portions are then dissolved and the gold deposited thereon is thereby removed by a lift-off technique. In this manner further interconnection layers 28 and 29 (FIGS. 15 and 16) are obtained. In the position where the replacement element 23 is present the further interconnection layers form direct contact to parts of the contact layers 3 and 4 respectively and further extend over the residual parts of the previously applied interconnection layers 18 and 19 respectively where said layers 18 and 19 respectively where said layers 18 and 19 extend over the thicker parts of the end portions of the lead-out conductors 12 and 13. In the positions of the originally applied elements the newly formed conductive layer interconnections 28 and 29 serve only to increase the thickness of the previously applied conductive layer interconnections 18 and 19 respectively as they are formed lying directly thereon.

Following the said application and definition of the second gold interconnection layer the substrate 10 with applied elements and replacement element is again mounted on the end surface of the inner glass member of the Dewar encapsulation and wire connections made from the lead-out conductors 12, 13 to the terminal posts. After the sealing of the Dewar encapsulation and, where relevant, evauaction a further resting procedure is carried out as previously described.

If any of the originally applied elements or even the replacement elements do not meet the resting requirements then the encapsulation is broken and further element replacement and interconnection is effected in exactly the same manner, again using the same masking for defining openings in the newly applied photoresist layer. In this context it is mentioned that in a large array of some 200 elements it has been found possible to effectively use this process five times, that is in total six separate photomasking and deposition stages for applying conductive layer interconnections.

Figure 17:
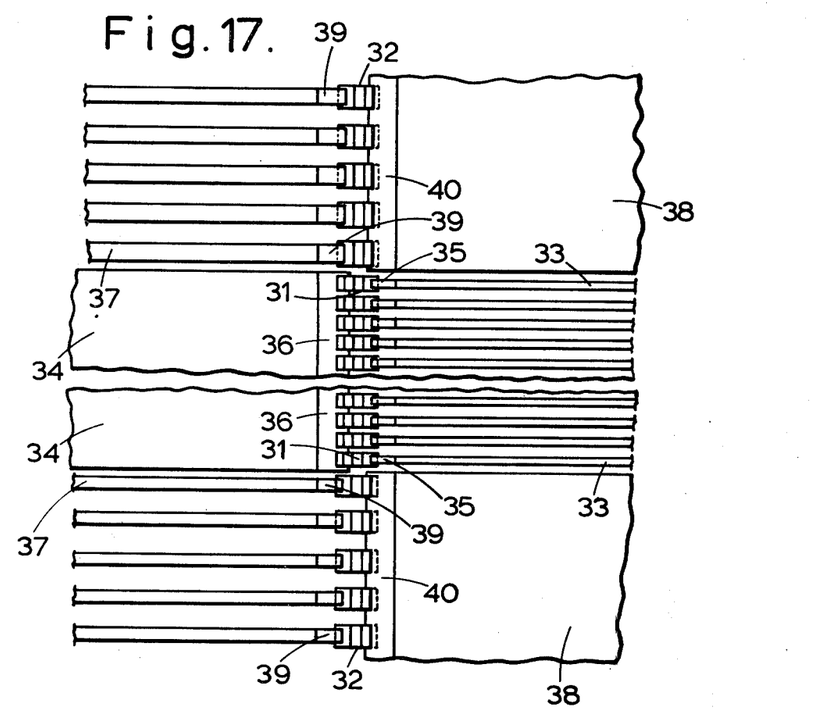
FIG. 17 is a plan view of part of another multi-element infra-red detector device manufactured by a method in accordance with the invention.

Referring now to FIG. 17 there will be briefly described another device which is manufactured by a method in accordance with the present invention In this device there are 192 infra-red detector elements in a linear array mounted on an insulating substrate. The elements are arranged in three groups, namely an inner group of 96 elements and two outer groups each of 48 elements. FIG. 17 shows two parts of the inner groups of 96 elements, these elements being indicated by reference numeral 31, and parts of the two outer groups each of 48 elements arranged immediately adjacent and on opposite sides of the inner group of elements, the elements in the outer groups being indicated by reference numeral 32. The inner elements 31 are of the same size, configuration and spacing as in the previously described embodiment, that is of 200 microns $\times$ 50 microns width, having an active surface area of 50 microns $\times$ 50 microns and the pitch distances of the elements being 62.5 microns. The outer elements 32 are of 200 microns $\times$ 100 microns width having an active surface area of 50 microns $\times$ 100 microns and the pitch distances of the elements being 180 microns.

On the surface of the insulating substrate there is a pattern of lead-out conductors. The lead-out conductors associated with the 96 inner elements 31 consist of a group of 96 conductors 33 of which the inner end portions consist of strips of 45 microns width, and a common conductor 34. As in the previously described embodiment the end portions of the conductors 33 and 34 define a spacing of 50 microns corresponding to the dimension in this direction of the active surface areas of the elements 31. Furthermore the elements 31 are mounted above reduced thickness parts of the end portions of said lead-out conductors 33 and 34. The lead-out conductors associated with each group of 48 outer elements 32 consist of a group of 48 conductors 37 of which the inner end portions consist of strips of 90 microns width, and a common conductor 38. As in the previously described embodiment the end portions of the conductors 37 and 38 define a spacing of 50 microns corresponding to the dimension in this direction of the active surface areas of the elements 32. Furthermore the elements 32 are mounted above reduced thickness parts of the end portions of said lead-out conductors 37 and 38.

Interconnections between contact layers extending over the curved edges of the elements 31, 32 and the lead-out conductors 33, 34, 37, 38 are formed in the same manner as described in the previous embodiment. Thus this interconnection between the lead-out conductors 33 and 34 and the contact layers on the elements 31 is via a plurality of conductive layer strip parts 35 of 130 microns $\times$ 45 microns on one side of the elements and via a common conductive layer part 35 of 130 microns $\times$ 1.0 mm on the opposite side of the elements. The interconnection between the lead-out conductors 37 and 38 and the contact layers on the elements 32 in each outer group of said elements 32 is via a plurality of conductive layer strip parts 39 of 130 microns $\times$ 90 microns on one side of the elements and via a common conductive layer part 40 of 130 microns $\times$ 2.88 mm on the opposite side of the elements.

The formation of the interconnections 35, 36, 39, 40, is as described in the previous embodiment and the testing, removal of faulty elements followed by their replacement and further interconnection using the same masking for defining openings in an applied photoresist layer as was used in the initial process for forming the interconnections is also as described in the previous embodiment.

Figure 18:
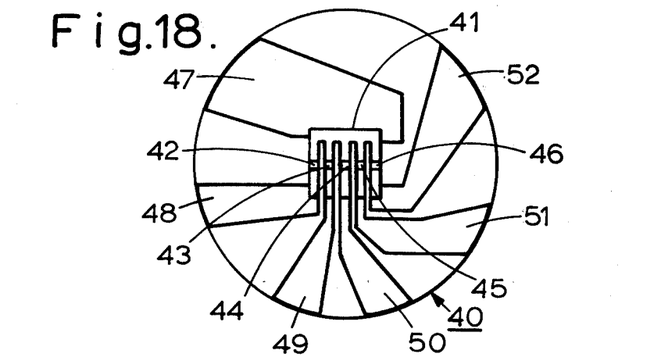
FIG. 18 is a plan view of an insulating substrate having an applied conductive pattern of lead-out conductors together with a single infra-red detector element, having five active surface areas, adhered to the substrate.

FIG. 18 shows in plan view part of another infra-red detector device at a stage in the manufacture thereof by a method in accordance with the invention. This device comprises an insulating substrate 40 having thereon a conductive pattern of lead-out conductors 47–52 inclusive provided for establishing electrical connection to a single infra-red detector elemental body 41 having defined therein five separate active surface areas 42–46 inclusive. FIG. 18 shows the body 41 adhered to the substrate 40 but prior to the application of conductive layer interconnections between end portions of the lead-out conductors 47–52 and conductive contact layers on the elemental body.

The elemental body 41 is of cadmium mercury telluride having overall dimensions of 825 microns $\times$ 525 microns and having a thickness of 8 microns. The elemental body 41 has been etched into a comb-form to define five finger portions in which the active surface areas 42–26 are defined, each active surface area being of 125 microns $\times$ 125 microns. The width of the channels in the elemental body between said finger portions and hence the spacing of the active surface areas is 50 microns. The longitudinal edges at the upper body extending parallel to and on opposite sides of the active surface areas are rounded and have contact layers thereon.

Figure 19:
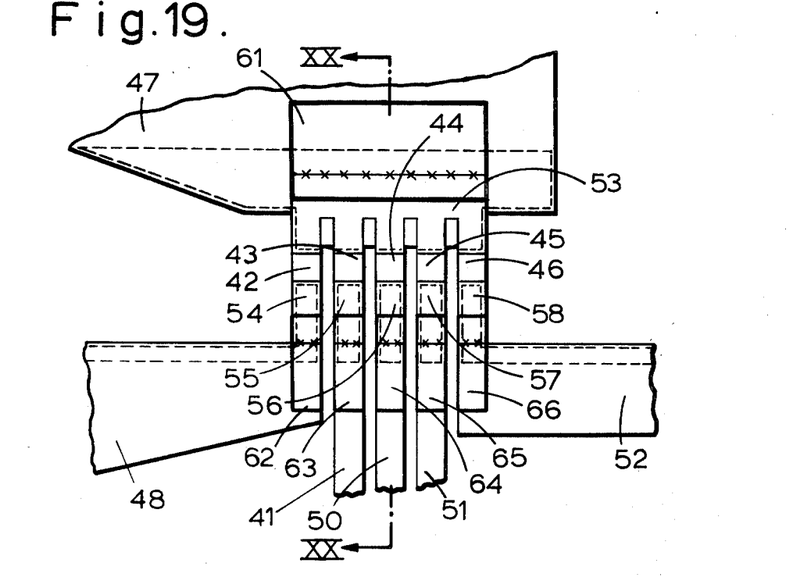
FIG. 19 is an enlarged plan view of part of the device shown in FIG. 18, at a stage in the manufacture after forming conductive interconnections between the element and the conductive pattern.
Figure 20:
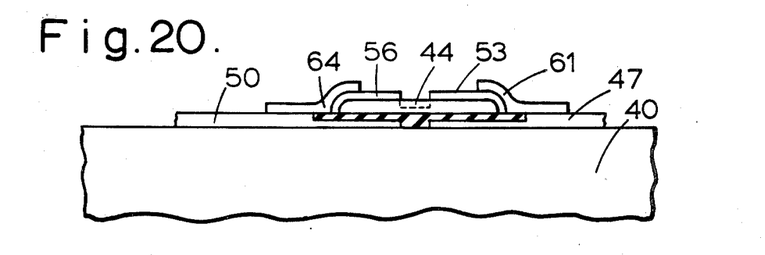
FIG. 20 is a cross-sectional view taken on the line XX—XX of FIG. 19.

FIG. 19 shows an enlarged plan view of the elemental body 41 and conductive pattern on the substrate after forming interconnections between the contact layers on the element and end portions of the lead-out conductors 47-52 of the pattern, and FIG. 20 is a cross-section along the line XX—XX in FIG. 19 extending through the active surface ares 42. The elemental body 41 in the form of a comb has a common contact layer 53 on the base side and five separate contact layers 54-58 inclusive individually associated with the strip parts of the body in which the active surface areas 42-26 are defined between the facing edges of the common contact layer 53 and the contact layers 54-58.

The end portion of the lead-out conductor 47 of the pattern comprises a part which is of reduced thickness and has four small identations at its edge which are to correspond with the channels between the strip portions of the elemental comb-shaped body 41. The transisition to the thicker part of the end portion of the lead-out conductor 47 is indicated by broken line in FIG. 19. The end portions of the five lead-out conductors 48-52 also comprises parts of reduced thickness. These reduced thickness parts are in the form of strips of 125 microns width and having a spacing of 50 microns. The boundaries of the reduced thickness parts of the end portions of the lead-out conductors 48-52 are also indicated by broken lines in FIG. 19. The facing edges of the end portion of the lead-out conductor 47 and the end portions of the lead-out conductors 48-52 are spaced by 125 microns. Thus the pattern of lead-out conductors serves to define the location of the active surface areas of the elemental body. In FIG. 19 the body having said active surface areas is shown present. For the sake of clarity of illustration, although the edges of the contact layers 53-58 on the body will substantially coincide with the underlying edges of the end portions of the lead-out conductors, these are both shown alongside one another in FIG. 19. The parallel extending longitudinal edges of the elemental body are indicated in FIG. 19 by chain lines.

Interconnection between the contact layer 53 on one side of the active surface areas in the elemental body and the end portion of the lead-out conductor 47 is by way of a deposited conductive layer 61 of rectangular surface area. Interconnection between the contact layers 54-58 at the other sides of the active surface areas and the end portions of the lead-out conductors 48-52 respectively is by way of deposited conductive layers 62-66 respectively, each in the form of a strip of 125 microns width. The conductive layer interconnections 61-66 are formed by first defining apertures in an applied photoresist layer, depositing gold and then removing the excess gold on the photoresist by a lift-off technique as in the first described embodiment of the method. This embodiment demonstrates the application of the contacting method to a single elemental body having defined therein a plurality of active surface areas. It is of course possible to modify this embodiment to form in a single elemental body active surface areas of different sizes and/or spacing.

It will be appreciated that many modifications are possible within the scope of the invention. The method may be employed in addition for forming detector devices comprising single elements or linear arrays of elements, as described in the embodiments, for forming detector devices in which the element configuration and/or arrangement is different, for example rectangular elements in split-linear arrays having a staggered formation, or single element devices or arrays in which the elements are of a surface configuration which is other than rectangular, for example annular. The method may also be employed in the manufacture of detectors in which the or each element is of a material other than cadmium mercury telluride and also where the or each active surface area comprises a p-n junction employed for the detection of infra-red radiation.

Materials other than alumina may be used for the insulating substrate on which the pattern of lead-out conductors is present, for example substrates of silicon, sapphire, or beryllia may be used. Furthermore conductive layers other than gold may be employed for the interconnection, for example of aluminum or silver.

In all the embodiments described the conductive layer interconnections are applied by deposition of metal in apertures formed in a layer of photoresist which is subsequently removed with the excess metal thereon. However, within the scope of the invention there are other methods of applying conductive material for the interconnections, for example by forming a layer of a conducting epoxy resin from a single droplet, either with or without the presence of a masking layer. The latter method may be suitably employed in devices in which the or each element is of reasonably large size. It has been successfully employed without masking layers being present as a means of applying the conductive layer interconnections between a replacement element and the adjacently situated end portions of the lead-out conductors in a device comprising an array of elements.

What is claimed is:

1. A method of manufacturing an infra-red detector device, comprising the steps of providing at least one detector element of infra-red sensitive material having at one major side at least one active surface area defined between a pair of electrically conductive contact layers spaced apart on the surface and which extend over a pair of oppositely curve edges of the element at the said one major side, adhering the opposite major side of the element to an insulating substrate provided on one surface with an electrically conductive pattern of lead-out conductors, the said oppositely located curved edges of the element being located in the proximity of oppositely located end portions of lead-out conductors of the pattern, and applying electrically conductive material to form interconnections between the contact layers on the element and the adjacently situated end portions of the lead-out conductors, said interconnections extending as conductive layers on the upper surface of the lead-out conductors and at least on those portions of the contact layers of the element situated over the said curved edges at the one major side.

2. A method as claimed in claim 1, wherein the electrically conductive pattern is such that for the mounting of the element, in a direction extending between the said oppositely located curved edges of the element the distance between oppositely located end portions of the associated lead-out conductors corresponds substantially to the dimension in said direction of the active surface area of the element between the pair of contact layers, the element being mounted on the substrate with the active surface area situated above the interval between said end portions of the lead-out conductors and with the contact layers situated above the end portions of the lead-out conductors.

3. A method as claimed in claim 2, wherein the end portions of the lead-out conductors of the pattern at least over the length thereof above which an element is supported are of reduced thickness.

4. A method as claimed in claim 3, wherein the interconnections formed as conductive layers extend on the lead-out conductors beyond the parts thereof of reduced thickness.

5. A method as claimed in claim 3, wherein the element is strip-shaped and of substantially rectangular surface area, the pair of contact layers and the active surface area defined therebetween extending across the width of the strip.

6. A method as claimed in claim 5, wherein the end portion of the lead-out conductor and the conductive layer interconnection at least on one side of the active surface area of the element are both in the form of metal strips extending substantially parallel to the element.

7. A method as claimed in claim 6, wherein the device comprises at least one group of detector elements having their active surface areas arranged in a substantially straight line, the end portions of the lead-out conductors to be overlaid by contact layers extending on one edge of the group of the elements being present on the surface of the insulating substrate in the form of a plurality of substantially parallel extending strips situated substantially normal to the said line and having a pitch distance corresponding substantially to the desired pitch distance of the elements.

8. A method as claimed in claim 7, wherein for connection to the contact layers extending on the other edges of said group of elements a common lead-out conductor is present on the insulating substrate, the longitudinal edge of the end portion of said common lead-out conductor to be overlaid by the said contact layers extending on said other edges lying substantially parallel to the said line.

9. A method as claimed in claim 8, wherein the device comprises a plurality of said groups of detector elements and on each of the two opposite sides of the line in which the active surface areas of the detector elements are to be arranged the lead-out conductors are present on the surface of the insulating substrate alternately as a plurality of strips associated with one group of detector elements to be provided and as a common lead-out conductor associated with the next adjacent group of detector elements to be provided.

10. A method as claimed in claim 9, wherein the pitch distance between individual ones of a first plurality of the elements present in the device is different from the pitch distance between individual ones of a second plurality of the elements in the device, said difference in pitch distances being accommodated by the provision of lead-out conductors on the insulating substrate having end portions in the form of strips of different pitch distances.

11. A method as claimed in claim 10, wherein the active surface areas of the elements present in the device are of at least two different sizes.

12. A method as claimed in claim 11 wherein the direction normal to the oppositely located curved edges of the elements all have the same dimension and the active surface area of each of the first plurality of elements is different from the active surface area of each of the second plurality of elements, said difference in active surface areas being provided by the elements having a different cross-dimension in the direction parallel to the oppositely located curved edges.

13. A method as claimed in claim 12, wherein after forming the interconnections between the contact layers on the element and the lead-out conductors, the element and its connection is tested, any element which fails to meet the testing requirements being mechanically removed from the insulating substrate and replaced by adhering a further element in the corresponding position on the surface of the insulating substrate, a further application of conductive material being effected to form interconnections at least between the contact layers on the replacement element and the adjacently situated end portions of the pattern of lead-out conductors.

14. A method as claimed in claim 13, wherein the provision of the first formed interconnections between the contact layers on the element and the lead-out conductors and the provision of the subsequently formed corresponding interconnections to the replacement element are both effected using a photomasking process, the same masking being used in each process.

15. A method as claimed in claim 14, wherein the application of conductive material to form interconnections is effected by deposition on portions of a photolithographically defined photoresist layer, said portions serving to mask surface parts of the element and the substrate where the deposited material is not required, the material deposited on the photoresist layer portions being subsequently removed by dissolving said photoresist layer portions.

16. A method as claimed in claim 15, wherein the element is adhered to the insulating substrate with an epoxy resin adhesive.

* * * * *